United States Patent [19]

Elliott

[11] 4,347,526
[45] Aug. 31, 1982

[54] RADIATION DETECTORS

[75] Inventor: Charles T. Elliott, Malvern, England

[73] Assignee: The Secretary of State for Defence in Her Britannic Majesty's Government of the United Kingdom of Great Britain and Northern Ireland, London, England

[21] Appl. No.: 140,506

[22] Filed: Apr. 15, 1980

[30] Foreign Application Priority Data

May 1, 1979 [GB] United Kingdom ................. 7915147

[51] Int. Cl.³ ............................................ H01L 27/14
[52] U.S. Cl. ......................................... 357/30; 357/55
[58] Field of Search .................................... 357/30, 55

[56] References Cited

U.S. PATENT DOCUMENTS

| | | | |
|---|---|---|---|
| 3,812,518 | 5/1974 | Kurz | 357/30 |
| 3,963,925 | 6/1976 | Breazeale | 357/30 X |
| 3,977,018 | 8/1976 | Catagnus | 357/30 |
| 4,131,486 | 12/1978 | Bradhoist | 357/30 X |
| 4,152,824 | 5/1979 | Gonsiorawski | 357/30 X |
| 4,162,177 | 7/1979 | Lindmayer | 357/30 X |
| 4,163,987 | 8/1979 | Kamath | 357/30 |

Primary Examiner—Martin H. Edlow
Attorney, Agent, or Firm—Pollock, Vande Sande & Priddy

[57] ABSTRACT

In a radiation detector including a substrate of photoconductive material having input and output contacts, the photocarrier flow-path between the two contacts includes regions of conductive material. These regions may be formed as strips overlying the substrate, or may be formed in grooves in the substrate. Alternatively, the substrate may comprise a number of separate regions of photoconductive material interconnected by regions of conductive material. The substrate is preferably of cadmium mercury telluride photoconductive material and the conductive regions of gold. Chromium may be used to provide a bond between the gold and cadmium mercury telluride. The substrate may be slotted to increase flow-path length between the two contacts.

11 Claims, 5 Drawing Figures

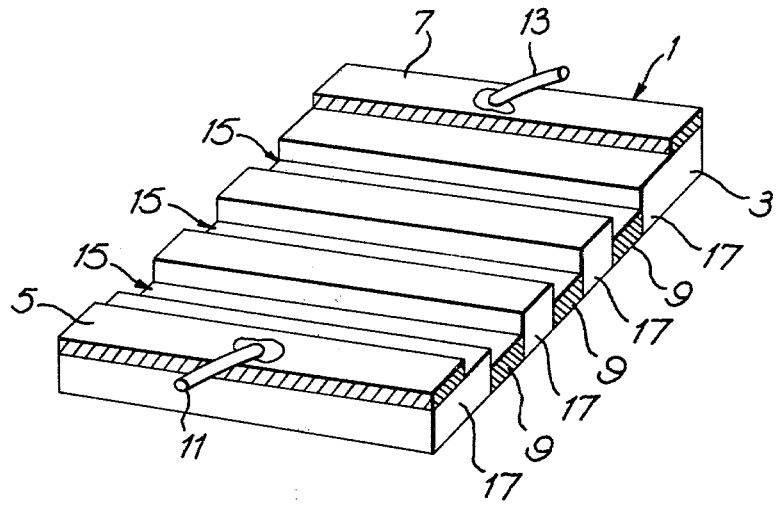
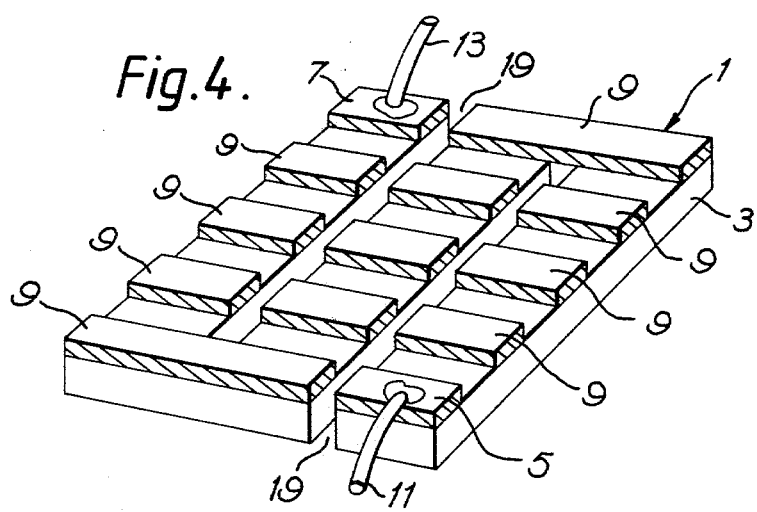

RADIATION DETECTORS

The present invention relates to radiation detectors, particularly, but not exclusively, fast large area, photo-conductive infra-red radiation detectors.

Infra-red radiation detectors are used in, for example, laser range-finding systems. In order to provide an adequate field of view, when used in conjunction with conventional optics, these detectors are often of large area typically ≳200 μm square. However, to afford efficient response in pulsed laser systems, high bandwidth >2 MHz is required, and, generally, to meet this requirement, photo-voltaic devices—eg. diode detectors—are used. On the other hand, while, in contrast, photo-conductive detectors are characterized by both low resistance and high noise equivalent resistance, and are readily suited, therefore, to amplifier matching, they are typified by low bandwidth response and are not, without modification, suited to such application. For example, a typical bandwidth for a 200 μm square conventional photo-conductive detector of eg. cadmium mercury telluride material would be of the order of 100 KHz.

There is thus a need for the bandwidth enhancement of large area photo-conductive detectors.

According to the present invention there is provided a radiation detector comprising:

a substrate of photo-conductive material, the material being capable of generating photo-carriers when radiation of appropriate wavelength is incident thereupon;

an input contact and an output contact spaced apart on the substrate for applying a drift field along the length of the substrate to cause flow of the photo-carriers so generated; and, a plurality of spaced regions of conductive material situate between the input and output contacts and arranged transverse to the direction of flow of the photo-carriers, the construction and arrangement of these regions being such that in operation a substantial proportion of the photo-carriers are recombined therein.

Conveniently the regions of conductive material may be in the form of strips in ohmic contact with the substrate on an upper or lower surface thereof.

Alternatively, the substrate may be grooved with a plurality of grooves extending from a surface thereof, the surfaces of these grooves being in ohmic contact with the conductive material.

Alternatively, the substrate may be divided into a plurality of spaced separated photo-conductive regions, each photo-conductive region being electrically connected to the next adjacent photo-conductive region by the conductive material, the conductive material being in ohmic contact with those surfaces of the substrate adjacent the dividing spaces.

Advantageously, the substrate material may be slotted to provide a meander configuration, the slots extending across the substrate alternately from one end and the other end thereof.

Preferably the photo-conductive material is cadmium mercury telluride $Hg_{1-x}Cd_xTe$; for example, the material $Hg_{0.79}Cd_{0.21}Te$ responsive to light of infra-red wavelength up to 12 μm, or the material $Hg_{0.72}Cd_{0.28}Te$ responsive to light of infra-red wavelength up to 5 μm.

Embodiments of the present invention will now be described, by way of example only, and with reference to the accompanying drawings of which:

FIG. 3 is a perspective view of an alternative photo-conductive detector, divided into separated photo-conductive regions;

FIG. 4 is a perspective view of a slotted photo-conductive detector having a meander configuration.

Figure 1:
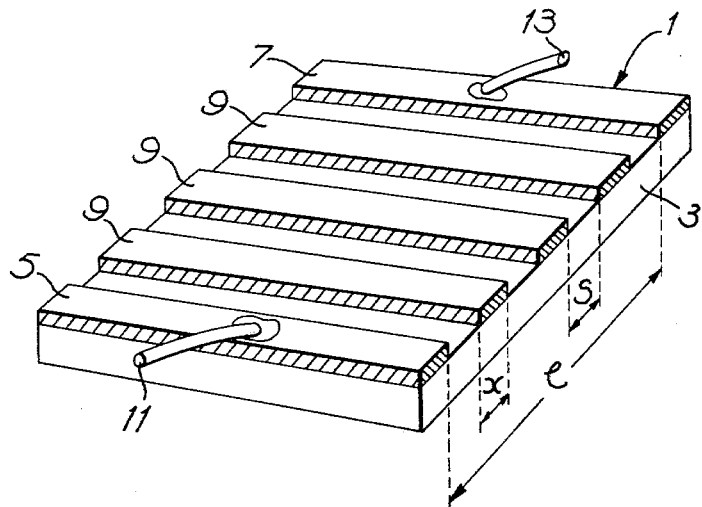
FIG. 1 is a perspective view of a photo-conductive detector provided with strips of conductive material.

As shown in FIG. 1 a photo-conductive infra-red detector 1 comprises a substrate 3 of photo-conductive material. At the ends of the substrate 3, and formed on the upper surface, are two electrode contacts, an input contact 5 and an output contact 7, respectively. Between these contacts 5 and 7 are three strips 9 of conductive material. Each strip is spaced apart from the next by a distance s and each is of width x. These strips lie on the upper surface of the substrate 3 and extend from one side of the substrate to the other. Each strip 9, and each contact 5 and 7, forms an ohmic contact with the substrate. Input and output fly leads 11 and 13 are bonded to the contacts 5 and 7.

The device shown is adapted to detect infra-red radiation of wavelength 10.6 μm. The substrate 3 is of cadmium mercury telluride material-$Hg_{0.79}Cd_{0.21}Te$ and typically, between contacts 5 and 7, is 200 μm square. Each strip is approximately 10 μm wide and spaced by a distance 42.5 μm. Typically the resistance of the substrate 3 between the contacts 5 and 7 is about 50 Ω. Each strip 9 is of gold material and is about 1 μm deep. The substrate 3 is 5 to 10 μm deep. The relative dimensions of the substrate 3 and the strips 9 are thus such that when the detector 1 is illuminated with inra-red radiation of wavelength 10.6 μm, a substantial proportion of photo-carriers generated within the photo-conductive material may be recombined in the conductive strips 9. The strips 9 effectively provide a resistive shunt path for the flow of current. Advantageously, the resistance in this path is substantially less than the resistance of the photo-conductive material in the alternative path provided by the adjacent photo-conductive material underlying each strip 9.

The detector 1 may be produced in a conventional manner. The substrate 3, therefore, may be cut or etched from a crystal slice of cadmium mercury telluride and mounted on a supporting substrate of insulating material, eg aluminum oxide (high purity sapphire). The contacts 5 and 7 and the strips 9 may be formed in known manner by photo-lithographic techniques. For example, the layer of photo-resist may be spun onto the upper surface of the substrate 3 and the pattern of the contacts 5 and 7, and strips 9 defined by selective optical illumination of the photo-resist. After subsequent removal of the illuminated regions of photo-resist by means of a suitable solvent, gold may be evaporated onto the surface of the remaining photo-resist and onto the exposed surface of the substrate 3. Alternatively the gold may be applied by sputtering. Subsequently, the photo-resist, and the gold overlying the photo-resist may be removed by a conventional float-off technique.

The power P dissipated by Joule heating in a conventional large area photo-detector of length l between current contacts, width ω and thickness t is generally expressed by the formula:

$$P = \frac{\omega t l^3}{\mu_a^2 \rho} \left(\frac{1}{\tau_s}\right)^2 \tag{1}$$

where $\mu_a$ is the ambipolar carrier mobility, p the resistivity of the photo-conductive material, and $\tau_s$ the response time of the detector. For optimum efficiency, the photo-detector is usually maintained at a low temperature, eg 77° K., by an associated cooling system. The effectiveness of this system and the physical properties of the photo-detector and insulator will determine whether the photo-detector performance is limited by the maximum total power $P_t$ which can be handled by the cooling system, or by the maximum power density $P_m$ which can be tolerated at the detector/insulating substrate interface, to avoid excessive temperature rise in the detector. The minimum value of the response time is given by one of the two expressions appearing below:

$$\tau_s(\min) = \left(\frac{\omega t}{\mu_a^2 \rho P_T}\right)^{\frac{1}{2}} \cdot l^{3/2}, \tag{2a}$$

or $$\tau_s(\min) = \left(\frac{t}{\mu_a^2 \rho P_m}\right)^{\frac{1}{2}} \cdot l. \tag{3a}$$

However, with the introduction of spaced conductive regions, as in this invention, the response time $\tau_s'$ of the detector is of substantially reduced value for a given power dissipation:

$$\tau_s'(\min) = \left(\frac{\omega t}{\mu_a^2 \rho P_T}\right)^{\frac{1}{2}} \cdot sl^{\frac{1}{2}}, \tag{2b}$$

or $$\tau_s'(\min) = \left(\frac{t}{\mu_a^2 \rho P_m}\right)^{\frac{1}{2}} s. \tag{3b}$$

where 's' is the length of photoconductive material between the conductive regions.

Comparing expressions (2a) and (2b), (3a) and (3b) it can be seen that the response time $\tau_s$ is reduced by the factor s/l:

$$\tau_s'(\min) = (s/l) \cdot \tau_s(\min) \tag{4}$$

Since the maximum frequency limit $f_{max}$ of the detector is related to the response time:

$$f_{max} \approx \tfrac{1}{2}\pi \tau_s'(\min) \tag{5}$$

it can be seen that the frequency response of the photo-detector may be increased by the introduction of conductive regions as described above.

Figure 2:
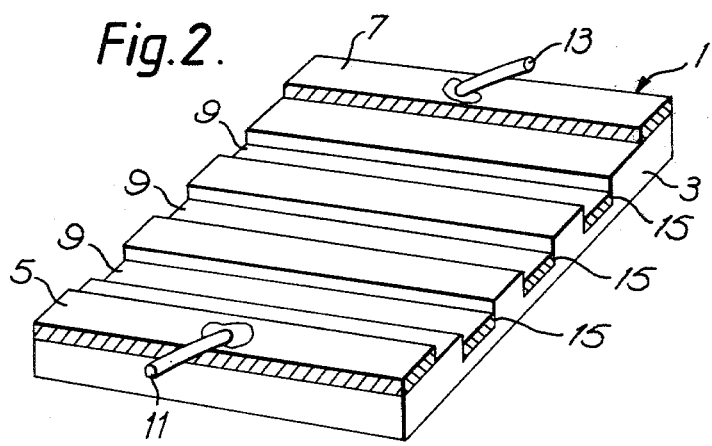
FIG. 2 is a perspective view of an alternative, grooved, photo-conductive detector.

Alternative constructions of the photo-detector 1 are shown in FIGS. 2, 3 and 4. As shown in FIG. 2, the substrate 3 of photo-conductive material is grooved. It has three grooves 15 extending from the upper surface of the substrate. These grooves 15 may be produced by conventional etching or by ion beam milling the substrate 3. In this way the relative resistance of the alternative current path is reduced and a greater substantial proportion of the photo-carriers are recombined in the conductive material. In this case the conductive material, eg gold, is formed in strips 9 on the floor of each groove 15 and adjacent the walls of each groove. This grooving may be carried to the extreme shown in FIG. 3. Here, the grooves 15 divide and separate the substrate 3 into a plurality of separated photo-conductive regions. The strips 9 here provide interconnective conducting links between the separated regions 17 and also provide intermediate regions of high photo-carrier recombination.

Figure 5:
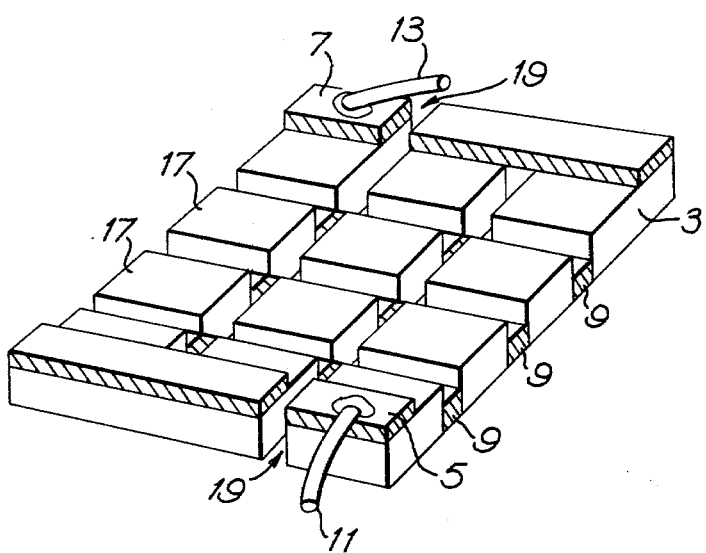
FIG. 5 is a perspective view of an alternative slotted photo-conductive detector having a meander configuration.

A variant of the structure shown in FIG. 1 is shown in FIG. 4. Here, the substrate 3 is divided by two slots 19 extending one from each end of the detector 1. The substrate 3 and strips 9 thus provide a detector of meander configuration. In this way an increased device resistance and an increased responsivity is achieved for a given bias current applied to flow between the two contacts 5 and 7. Similarly the detectors shown in FIGS. 2 and 3 may be modified by slotting to give this increased responsivity. For example, the detector shown in FIG. 3 may be provided with slots 19 as shown in FIG. 5. In the examples described above the regions 9 are of length approx. 10 μm, and depth 1 μm. The slots 19 are about 10 to 13 μm wide.

It also proves advantageous in the manufacture of cadmium mercury telluride/gold detectors to use chrome metal, intermediate the gold and cadmium mercury telluride, to provide, between these materials, effective ohmic and physical contact. Thus in the course of providing regions of conductive material, a thin layer ~400 Å (0.04 μm) of chromium, may be formed by sputtering, followed by sputtering of gold to a thickness ~1 μm.

Having now particularly described the invention and the manner in which it is performed, I claim:

1. A radiation detector comprising: a substrate of photoconductive material; a photosensitive element formed of the substrate material between an input contact to the substrate and an output contact to the substrate; there being defined a photocarrier flow-path between the input and output contacts; and a plurality of spaced separate regions of conductive material, each in ohmic contact with the substrate material, disposed in the photo-carrier flow-path for providing mean for recombining a substantial proportion of photocarriers generated in the substrate material, the spacing between the input contact and a first one of the regions of conductive material, between adjacent regions of the conductive material, and between a last one of the regions of conductive material and the output contact, being substantially less than the spacing between the input contact and the output contact, and such as to extend the bandwidth response of the element.

2. A detector according to claim 1 wherein the regions of conductive material are provided by conductive strips overlying the surface of the substrate, disposed in and across the photocarrier flow-path.

3. A detector according to claim 1 wherein the substrate has a plurality of grooves extending across the photocarrier flow-path, a region of the conductive material lying in each groove, the conductive material being in ohmic contact with the surface of that groove.

4. A detector according to claim 1 wherein the substrate comprises a plurality of separate regions of photoconductive material, each region of photoconductive material being electrically connected to the next adjacent region of photoconductive material by a region of the conductive material.

5. A detector according to claim 1, the substrate having at least one slot and defining a meander photo-carrier flow-path between the input and output contacts.

6. A radiation detector comprising: a substrate of cadmium mercury telluride photoconductive material responsive to infra-red radiation of wavelength lying in the 3 to 5 μm or 8 to 14 μm bands of the infra-red spectrum; a photosensitive element formed of the substrate material between an input contact to the substrate and an output contact to the substrate; there being defined a photocarrier flow-path between the input and output contacts; and a plurality of spaced separate regions of conductive material, each in ohmic contact with the substrate material, disposed in the photo-carrier flow-path for providing means for recombining a substantial proportion of photocarriers generated in the substrate material, the spacing between the input contact and a first one of the regions of conductive material, between adjacent regions of the conductive material, and between a last one of the regions of conductive material and the output contact, being substantially less than the spacing between the input contact and the output contact, and such as to extend the bandwidth response of the element.

7. A detector according to claim 6 wherein the conductive material is essentially of gold.

8. A detector according to claim 7 wherein the conductive material also includes chromium, provided in thin layer form as a bond between the cadmium mercury telluride and gold materials.

9. A large area infra-red detector comprising: a substrate of cadmium mercury telluride photoconductive material responsive to infra-red radiation of wavelength lying in the 3 to 5 μm or 8 to 14 μm bands of the infra-red spectrum, the substrate being composed of a plurality of spaced regions of the photoconductive material which together provide a photosensitive element formed between an input contact to the substrate and an output contact to the substrate, there being defined a photocarrier flow-path between the input and output contact, the substrate having alternate slots so that the flow-path defined meanders between the contacts; and a plurality of separate regions of conductive material, essentially of gold, connecting adjacent regions of the photoconductive material, a thin layer of chromium conductive material being provided at each interface between the cadmium mercury telluride and gold materials to effect ohmic contact and effective bonding therebetween, the spacing between the input contact and a first one of the regions of conductive material, between adjacent regions of the conductive material, and between a last one of the regions of conductive material and the output contact, between substantially less than the spacing between the input contact and the output contact, and such as to extend the bandwidth response of the element.

10. A detector according to claim 1 for use wherein the element bandwidth response is extended, the response time ($\tau_s$) of the element being reduced by a factor s/l, where "s" is the spacing between the adjacent regions of conductive material, and "l" is the spacing between the input and output contacts.

11. In a pulsed laser system, a detector according to claim 1, wherein the size of the element is matched to the size of the laser beam arranged to be incident thereon.

* * * * *